United States Patent [19]
Evelove et al.

[11] 3,934,074
[45] Jan. 20, 1976

[54] CERAMIC CIRCUIT BOARD MOUNTED IN HOUSING AND METHOD OF FABRICATION THEREOF

[75] Inventors: Leon G. Evelove, Los Angeles County; John S. Leone, Orange County; Don E. White, Los Angeles County, all of Calif.

[73] Assignee: TRW Inc., Redondo Beach, Calif.

[22] Filed: Apr. 22, 1974

[21] Appl. No.: 462,850

[52] U.S. Cl. .................. 174/52 R; 29/625; 29/627; 317/101 C; 317/101 R; 317/120
[51] Int. Cl.² ............................................. H05K 5/00
[58] Field of Search ........ 174/68.5, 52 R, 525, 50.5, 174/50.54, 50.56, 50.57, 50.61, 50.63, 35 GC; 317/101 B, 101 C, 101 DH, 101 R, 99, 100, 120; 29/625, 626, 627

[56] References Cited
UNITED STATES PATENTS

| | | | |
|---|---|---|---|
| 1,563,838 | 12/1925 | Daley | 220/3.8 |
| 2,873,109 | 2/1959 | Hartenstein et al. | 317/101 DH UX |
| 3,022,476 | 2/1962 | Koch | 174/35 GC |
| 3,195,026 | 7/1965 | Wegner et al. | 174/525 X |
| 3,337,775 | 8/1967 | Scales | 317/120 |
| 3,339,127 | 8/1967 | Darter et al. | 174/525 X |
| 3,388,301 | 6/1968 | James | 174/DIG. 3 UX |
| 3,553,532 | 1/1971 | Cheshire | 317/120 X |
| 3,579,046 | 5/1971 | Jordon | 317/120 |
| 3,848,078 | 11/1974 | Guillot, Jr. | 174/525 |

Primary Examiner—Darrell L. Clay
Attorney, Agent, or Firm—Daniel T. Anderson; Stephen J. Koundakjian; Edwin A. Oser

[57] ABSTRACT

Disclosed is an electrical circuit board structure incorporating a ceramic substrate wafer and metallic mounting means bonded to the substrate wafer for securing the structure to a housing. The metallic portion of the structure protects the ceramic wafer from mechanical stresses transmitted through the housing by providing structural integrity and dynamic isolation. Selection of such a metallic material having its coefficient of thermal expansion similar to that of the substrate material prevents the creation of thermal stresses between the ceramic and the metal portion of the structure.

The disclosed method comprises rigidly securing the ceramic substrate circuit board to the metallic member in such a way that the latter may be attached to the housing without stressing the ceramic material.

23 Claims, 3 Drawing Figures

CERAMIC CIRCUIT BOARD MOUNTED IN HOUSING AND METHOD OF FABRICATION THEREOF

BACKGROUND OF THE INVENTION

A. Field of Invention

This invention relates to ceramic substrate wafers for electrical circuit boards and methods by which they may be secured to structural housings.

B. Description of Prior Art

Perhaps the commonest circuit board material to which electrical circuit components are presently mounted comprises a sheet of glass fiber-filled epoxy. Glass fiber epoxy is relatively nonbrittle and, thus, such a circuit board may be readily attached to a structural housing by simply drilling holes into the circuit board material and inserting metal screws, which may be tapped into the housing and tightened. The relative non-brittleness of glass fiber epoxy also permits use of such circuit boards in rather extreme mechanical and thermo-mechanical environments without fear of cracking the board.

However, there exist electronic circuit board applications in which use of a glass fiber epoxy board is undesirable. For example, if such a board is used in very high frequency (approximately L-band and higher) communication devices, the relatively low dielectric constant of the material causes the electronic circuit to become "lossy".

In such applications, a ceramic substrate wafer, typically fused alumina or sapphire, is ordinarily employed for circuit board construction. However, due to their brittleness, ceramic wafers have a strong tendency to split or shatter, when subjected to vibration and other ordinary mechanical stresses.

Mounting of ceramic substrate circuit boards to housing structures presents additional difficulties. Screw mounting of the board directly to the housing cannot be readily accomplished, since if the ceramic wafer is not split during the process of drilling the holes for passage of the screws, it will most likely be at least locally cracked when the screws are tightened. Adhesive bonding or soldering of the ceramic substrate wafer onto the housing, beside making removal difficult, presents problems in connection with thermal expansion of the housing at a different rate from that of the ceramic material typically resulting in mechanical distortion of the housing, causing buckling and cracking of the circuit board.

SUMMARY OF THE INVENTION

Accordingly, it is an object of this invention to provide a ceramic substrate circuit board structure with an improved capacity to withstand vibration and other mechanical stresses, as well as thermal expansion stresses.

It is a further object of this invention to provide such a structure which may be attached to and detached from its housing with relative ease.

It is another object of this invention to provide a method of fabricating such ceramic substrate structures having such improved characteristics.

Briefly, the circuit board structure of the present invention comprises a wafer of ceramic material which is rigidly secured to one or more metal members. In the final structure, the metal members are attached to the ultimate housing by means of metal screws, soldering or the like, for simple detachment, if desired. The metal member(s) add structural integrity and a degree of mechanical isolation to the ceramic wafer in all embodiments of the invention. In certain embodiments, wherein the metal members comprise projecting tabs attached to the housing near their ends, these members provide additional mechanical isolation through spring action. Finally, where the metal is selected to possess a coefficient of thermal expansion substantially similar to that of the ceramic (i.e., within 20%), a thermal expansion stresses between the two materials can be substantially prevented.

DETAILED DESCRIPTION OF THE PREFERRED EMBODIMENT

The preferred embodiment of the present invention is perhaps best described in terms of the preferred method of constructing a ceramic circuit board structure.

The basic ceramic substrate wafer may be obtained off-the-shelf from one of a number of commercial manufacturers. It will consist of a relatively thin, substantially rectilinear sheet-like structure of a high-dielectric constant ceramic material, such as fused alumina or sapphire. Its dimensions will typically be of the order of approximately 2 ×5 cm, although the exact size is not critical to the present invention. Typically, the ceramic substrate wafer will not be perfectly flat, a factor which accentuates the inherent tendency of such ceramic wafers to split or crack when attached to structural housings by the methods heretofore commonly used. It will be seen, however, that this factor is of little consequence where ceramic substrate wafers are employed in the practice of the present invention.

Since the capacitance of the ceramic wafer is critical in most of the typically high-frequency applications for ceramic substrate circuit boards, care must be exercised in selecting a ceramic wafer of desired thickness and dielectric constant.

Figure 1:
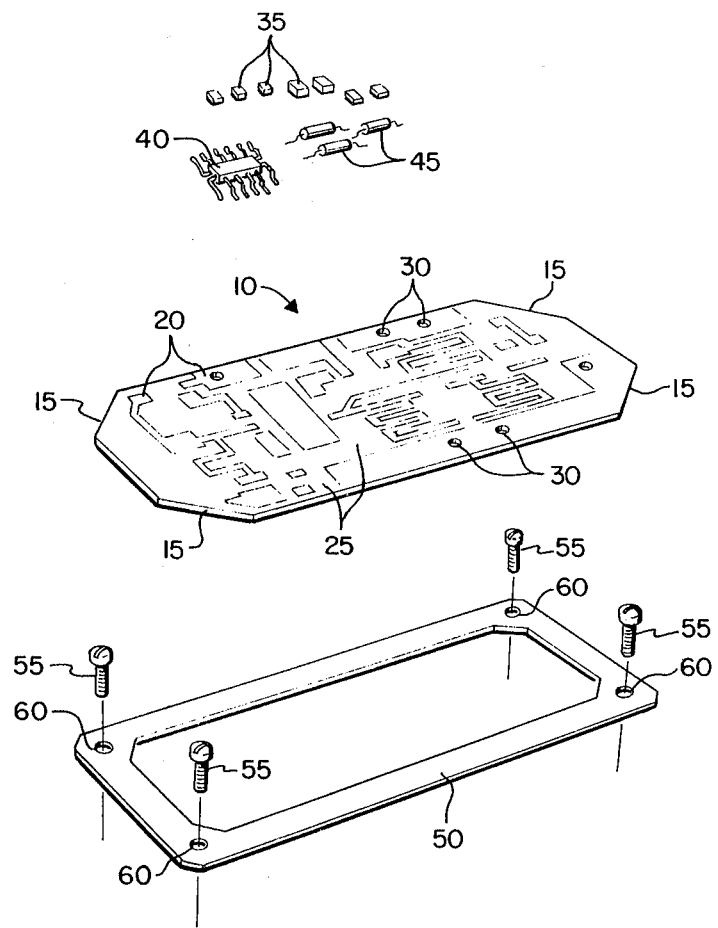
FIG. 1 is an exploded view of an electrical circuit board structure according to the preferred embodiment of the present invention.

As shown in FIG. 1, the essentially rectilinear ceramic wafer 10 is provided with chamfered corners 15, whose function will be explained below. These chamfered edges are provided by ordinary cutting techniques.

It is ordinarily desirable to provide a circuit board 10 having a metallic coating on both sides. The coating on the reverse side essentially covers that entire side, since it provides a common ground lead to the structural housing 75, to which the circuit board is secured. The coating on the front side of the circuit board, to which the circuit elements, e.g., resistor and capacitor chips 35, flat packs 40 and cased transistors and diodes 45, are mounted, consists of a conductor line pattern 20 interspersed with nonconductive areas 25 of the ceramic wafer. The circuit elements are mounted directly to the conductor line pattern in specified locations.

Electrical communication between the conductor line pattern 20 on the front face of the circuit board 10 and the rear face thereof is accomplished through ground holes 30, placed in specified locations in the ceramic wafer. The holes are created most efficiently by means of air-abrasive drilling, i.e., air blasting fine particles of silicon carbide through a diameter-controlled nozzle at both sides of the ceramic substrate wafer (one side at a time). Actual electric communication is provided by conductively plating the interior surfaces of the holes.

In the preferred embodiment of the present invention, preliminary metallization of the ceramic wafer 10 is accomplished by sputtering approximately 250 A thick layer of CERMET (a common nickel/chromium alloy) onto the ceramic, followed by sputtering an approximately 4000 A thick layer of gold onto the CERMET layer. Sputtering is employed in preference to vacuum deposition or other well-known deposition techniques. It appears to provide superior adhesion of the first two layers to the ceramic material and also appears to be superior in metallizing the interior walls of the grounding holes 30 which must be subsequently electroplated (for electrical conductivity), together with all other surfaces of the ceramic wafer which are not photoresist covered.

Following these preliminary metallizing steps, the front face of the ceramic wafer 10, i.e., that shown in FIG. 1, must be masked so that the nonconductive regions 25 will be formed when final metallizing takes place. Any well-known masking technique may be applied. It is preferable, however, that dry-process photoresist, extensively employed in the printed circuit board industry, be used. Dry-process photoresist may be obtained off-the-shelf from commerical suppliers in rolls of laminar sheets and is applied to the front face of the ceramic wafer under moderate heat and pressure. Since it may be purchased with a protective Mylar coat, it is relatively simple to handle. The conductor line pattern is optically focused onto the photoresist coated wafer, which renders the exposed (conductor line) portion soluable in the developer solution. The undissolved portions remain after developing creating the desired mask, which provides the nonconductive portion of the circuit board after the latter is metalized.

Final metalization is applied to the masked, preliminarily metalized ceramic wafer 10 as follows:

1. A layer of copper, approximately 0.001 cm in thickness is electroplated onto all surfaces of the wafer (which are not photoresist covered);
2. A layer of gold approximately 0.0004 cm in thickness is electroplated onto the copper to prevent oxidation;
3. The photoresist is dissolved away;
4. The thin gold and CERMET preliminary metalization layers are etched away with a suitable etchant, such as aqua regia, leaving bare the non-conductive regions 25. Since preliminary layers are much thinner than the copper and gold overlayers, there is little danger that any substantial portion of the latter will be etched away; and
5. The entire circuit board is solder dipped with 63–37 lead-tin solder to dissolve away the gold (which would prove undesirable for some applications), and to provide solder-tinned surfaces for application of circuit elements 35, 40, 45 and to facilitate attachment of the completed circuit board 10 to its metal frame 50. The solder will not adhere to the bare ceramic areas.

This produces the circuit board 10 essentially as shown in FIG. 1 in which the grounding holes 30 are internally plated with conductive material to provide communication between the conductor line network 20 and the metallic surface on the rear of the wafer (not shown).

The circuit elements 35, 40, 45 are attached to the circuit board 10 by tinning their leads and attaching by solder reflow. The solder reflow step will be described in greater detail below.

A key step in the fabrication of the ceramic circuit board structure consists in securing the circuit board 10 to the metal frame 50. The metal frame comprises a substantially rectilinear, "hollow", substantially planar structure, as shown in FIG. 1. In order to prevent differential thermal expansion between the wafer and the frame when they are mutually rigidly secured, the metal comprising the frame should be chosen to have a coefficient of thermal expanion similar to that of the ceramic material comprising the wafer. In the preferred embodiment of the present invention, wherein the ceramic material comprises fused alumina, it is preferred that a KOVAR (an iron-nickel-cobalt alloy) frame be employed.

The dimension of the frame 50, as compared to those of the circuit board 10, are such that, when mounted to the frame, the frame extends beyond the ceramic wafer only at the four chamfered corners 15 of the ceramic wafer. This allows mounting the circuit board structure 65 into the housing 75 within the rectangular planar outline of the ceramic substrate board, which results in a minimum housing enclosure volume.

Figure 2:
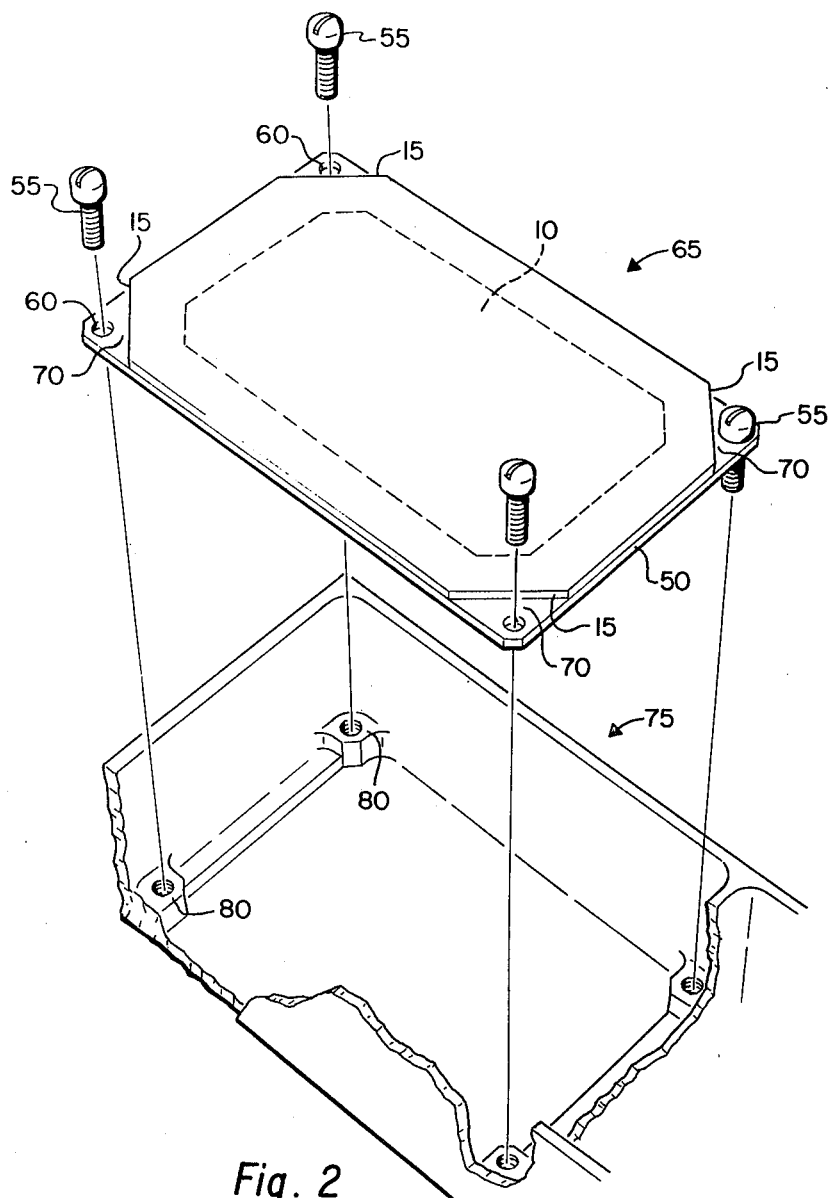
FIG. 2 is an exploded, partially cutaway view of the circuit board structure and the housing structure to which it is secured, according to the embodiment shown in FIG. 1.

In addition, a space 70 should be provided between each chamfered edge 15 and the nearest mounting screw 55 which will be passed through its associated mounting hole 60 (see FIG. 2). This is to assure that if mechanical vibration or other mechanical stresses are passed directly from the housing structure 75 to the circuit board structure 65, they will be passed into the metal frame 50, rather than directly into the ceramic chip 10. In this way the metal frame can serve to insulate the wafer from these mechanical stresses.

It should be noted that since it is the frame 50 which is directly mounted to the threaded bosses 80 of the housing structure 75, warping and other structural irregularities of the ceramic wafer 10 are of no concern. The means of attachment between the ceramic wafer and the metal frame may be selected to insure rigid securing of the ceramic wafer to the frame regardless of the dimensional imperfections of the former. Likewise, the surfaces of the four mounting bosses 80 in contact with the frame 50 may not be in a perfect plane, due to improper construction or mechanical distortion of the housing 75. This irregularity is of no consequence to the circuit board structure 65 because the metal frame 50 extending beyond the ceramic wafer chamfered corners 15 can compensate for this without involving in any way the ceramic wafer 10.

In the preferred embodiment of the present invention a KOVAR frame 50 approximately 0.04 cm in thickness is soldered to the underside (ground side) of the circuit board 10. The KOVAR frame is prepared for solder attachment by electroplating onto the frame a nickel flash, followed by a 0.001 cm copper layer and a 0.0004 cm gold layer. The electroplated frame is then masked on the side opposite the one to which the circuit board is to be mounted and dipped into a solder pot, thus tinning the side to which the circuit board is to be applied.

The final assembly step of the circuit board structure of the preferred embodiment of the present invention comprises placing the circuit elements 35, 40, 45 in their respective positions in contact with the conductive line network 20 of the circuit board 10; placing the circuit board atop the electroplated and tinned KOVAR frame 50; and subjecting the entire assembly in infrared radiation, whereby the solder coating on the conductive line network reflows over the component leads, and the solder surface on the reverse (ground) side of the circuit board flows together with the solder surface on the KOVAR frame, thus securing the entire assembly.

Even in cases where the ceramic wafer, from which the circuit board 10 is fabricated, is warped or otherwise dimensionally imperfect, the preferred method of attachment will insure that a strong bond occurs between the circuit board and the KOVAR frame 50.

The completed circuit board structure 65 is mounted to the structural housing 75 by passing mounting screws 55 through their respective mounting holes 60 and inserting them into the threaded bosses 80 on the mounting structure.

Direct contact between the circuit board structure 65 and the housing structure 75 provides electrical ground communication for the electrical components 35, 40, 45 mounted on the wafer 10 by means of the metallic ground surface on the rear of the wafer, through the metallic plated holes 30 in the wafer, and the metallic conductive lines 20 on the wafer surface. The method of electrical contact, from an outside source, to the wafer metallic conduction lines 20, other than for electrical grounding purposes, is effected by soldering an outside source wire to the conduction line 20. The only requirement is that the wire be of a flexible nature to prevent the wire from passing mechanical vibration or other mechanical forces from the housing structure 75 to the circuit board structure 65.

A wide range of variation may be introduced, by those skilled in the art, to the fabrication method described above without departing from the scope of the present invention.

For example, the method and resulting circuit board structure 65 may utilize a ceramic wafer 10 of substantially any desired shape, provided that the metal frame 50 to which it is secured and the placement of the mounting means in the latter are such that the entire structure may be satisfactorily mounted in the housing intended to accomodate it. It is important, however, to insure that spaces 70 exist between the ceramic wafer and the mounting screw 55 or other means employed to mount the composite structure to the housing. This is to insure that the ceramic wafer is protected from the direct introduction of mechanical shocks and stresses from the housing. In particular, the ceramic wafer need not possess chamfered edges 15, so long as some such isolation is provided.

Figure 3:
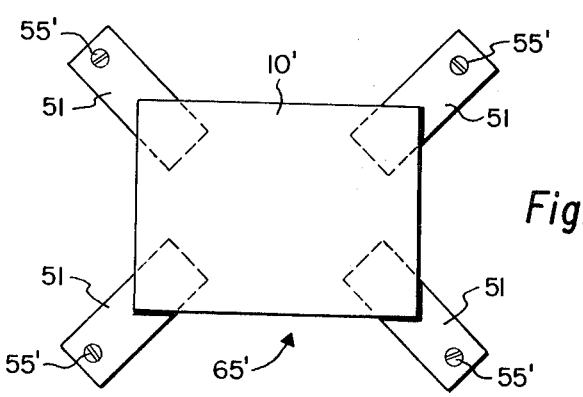
FIG. 3 is a plan view of a circuit board structure according to an alternative embodiment of the present invention.

In addition, while in the preferred embodiment of the present invention a KOVAR frame 50 substantially shown in FIG. 1, is utilized in connection with the rectilinear ceramic wafer 10, this is not absolutely necessary for the practice of the invention. All that is really necessary is to provide some structurally sound means for supporting the ceramic wafer and mechanically securing it to a housing structure from which it is at least somewhat isolated in terms of mechanical energy transfer. For example, as shown in FIG. 3, the composite circuit board structure 65' might consist of a ceramic wafer 10' supported by a plurality of tabs 51, bonded to the underside of the wafer, which tabs are secured to the housing structure by means of mounting screws 55'. It is preferable, however, that the material selected for the supportive structure(s) be of similar thermal expansion coefficient to the ceramic selected for the wafer in cases where the composite structure is subjected to thermal stresses, as in spacecraft applications.

Likewise, the circuit board 10 may have conductive lines 20 and/or circuit components 35, 40, 45 mounted onto both sides with internal electrical communication means and grounding means other than those described above provided.

The particular method of bonding the circuit board 10 to the KOVAR frame 50 or other supportive member, is also not critical to the practice of the present invention, provided the bonding method employed furnishes a reasonably secure bond. Thus, adhesive bonding, particularly by means of epoxy materials, can be substituted for the reflow solder method described above. Again, in applications likely to result in the creation of thermal stresses, the frame/board interface should be selected to minimize their effect on the circuit board.

We claim:

1. A ceramic circuit board structure, comprising:
   a wafer of ceramic material, said wafer adapted to rigidly support electrical circuitry elements;
   at least one metallic support member, at least a part of said support member being substantially planar, said part of said support member being rigidly secured to said wafer, at least a substantial portion of a surface of said part being in juxtaposition with at least a portion of a surface of said wafer, a portion of said member extending beyond the periphery of said wafer;
   a rigid housing structure; and
   mounting means selectively securing said support member to said housing structure, with no portion of said wafer being in contact with any portion of said mounting means or said housing structure to clarify the meaning of such phrase;
   said support member being the sole support for said wafer.

2. The structure as recited in claim 1, wherein circuitry elements are supported on both surfaces of said wafer.

3. The structure as recited in claim 1, wherein circuitry elements are supported on a single side of said wafer.

4. The structure as recited in claim 3, wherein the region of juxtaposition is on the side of said wafer opposite that on which the circuitry elements are supported.

5. The structure as recited in claim 1, wherein said at least one support member is a plurality of support members.

6. The structure as recited in claim 5, wherein each of said members comprises a metallic tab.

7. The structure as recited in claim 6, wherein said wafer is substantially rectilinear and said tabs extend from at least two of the corners thereof.

8. The structure as recited in claim 7, wherein four tabs are provided and each extends from a corner of said wafer.

9. The structure as recited in claim 1, wherein the means for said rigid securing comprises solder.

10. The structure as recited in claim 1, wherein the means for said rigid securing comprises an adhesive.

11. A ceramic circuit board structure, comprising:
a wafer of ceramic material, said wafer adapted to rigidly support electrical circuitry elements;
at least one metallic support member, at least a part of said support member being substantially planar, said part of said support member being rigidly secured to said wafer, at least a substantial portion of a surface of said part being in juxtaposition with at least a portion of a surface of said wafer, a portion of said member extending beyond the periphery of said wafer, the coefficient of thermal expansion of said support member being substantially similar to that of said ceramic material;
a rigid housing structure; and
mounting means selectively securing said support member to said housing structure, with no portion of said wafer being in contact with any portion of said mounting means or said housing structure to clarify the meaning of such phrase;
said support member being the sole support for said wafer.

12. The structure as recited in claim 11, wherein said ceramic material comprises fused alumina.

13. The structure as recited in claim 11, wherein said ceramic material comprises sapphire.

14. The structure as recited in claim 11, wherein the metallic material comprising said support member comprises an iron, nickel and cobalt alloy.

15. The structure as recited in claim 11, further including electrical circuitry elements rigidly supported by said wafer, and wherein a ground connection between said ceramic wafer and said circuitry elements is provided through at least a portion of the juxtaposition interface.

16. The method of fabricating a ceramic circuit board structure, comprising the steps of:
providing a wafer of ceramic material, said wafer adapted to rigidly support electrical circuitry elements, said step of providing including coating at least a portion of a surface of the wafer with solder;
placing, in juxtaposition with the solder-coated portion of the surface of said wafer, a portion of a surface of a substantially planar support member, said support member adapted to be secured to a housing structure at a region of said support member remote from said juxtaposition region, said step of placing including coating at least that portion of the surface of the support member placed in juxtaposition with said wafer with solder;
reflow soldering said support member to said wafer at said region of juxtaposition therebetween, said step of reflow soldering comprising subjecting at least the region of juxtaposition between said wafer and said support member to heat sufficient to melt said solder;
furnishing electrical circuitry elements;
tinning the leads of said circuitry elements with solder; and
causing said tinned leads to be in contact with said wafer during said step of reflow soldering.

17. Method as recited in claim 16, wherein said heat comprises infrared radiation.

18. The method of fabricating a ceramic circuit board structure, comprising the steps of:
providing a wafer of ceramic material, said wafer adapted to rigidly support electrical circuitry elements, said step of providing including coating at least a portion of a surface of the wafer with solder;
placing, in juxtaposition with the solder-coated portion of the surface of said wafer, a portion of a surface of a substantially planar support member, said support member adapted to be secured to a housing structure at a region of said support member remote from said juxtaposition region, said step of placing including coating at least that portion of the surface of the support member placed in juxtaposition with said wafer with solder;
reflow soldering said support member to said wafer at said region of juxtaposition therebetween, said step of reflow soldering comprising subjecting at least the region of juxtaposition between said wafer and said support member to heat sufficient to melt said solder;
furnishing electrical circuitry elements having tinned leads and;
causing said tinned leads to be in contact with said wafer during said step of reflow soldering.

19. Method as recited in claim 18, wherein said heat comprises infrared radiation.

20. A ceramic circuit board structure, comprising:
a substantially rectilinear wafer of ceramic material, said wafer adapted to rigidly support electrical circuitry elements;
a single metallic support member, of substantially hollow rectilinear configuration, said support member being rigidly secured to said wafer, at least a substantial portion of a surface of said member being in juxtaposition with at least a portion of a surface of said wafer, a portion of said member extending beyond the periphery of said wafer;
a rigid housing structure; and
mounting means selectively securing said support member to said housing structure, with no portion of said wafer being in contact with any portion of said mounting means or said housing structure to clarify the meaning of such phrase;
said support member being the sole support for said wafer.

21. The structure as recited in claim 20, wherein:
said extended portion comprises at least two diametrically opposite corners of said support member, each of said corners being provided with a hole for the passage of a screw; and
said mounting means comprises a screw inserted through each of said holes and engaging a threaded hole in said housing structure.

22. The structure as recited in claim 21, wherein said extended portion comprises all four corners of said support member.

23. The structure as recited in claim 20, further including electrical circuitry elements rigidly supported by said wafer, and wherein a ground connection between said circuitry elements and said support member is provided through at least a portion of the juxtaposition interface.

* * * * *